United States Patent [19]

Swamy et al.

[11] Patent Number: 5,392,980
[45] Date of Patent: Feb. 28, 1995

[54] METHOD AND APPARATUS FOR REWORKING BALL GRID ARRAY PACKAGES TO ALLOW REUSE OF FUNCTIONAL DEVICES

[75] Inventors: Deepak N. Swamy, Austin; Scott Estes, Austin; James Bell, Cedar Park, all of Tex.

[73] Assignee: Dell USA, L.P., Austin, Tex.

[21] Appl. No.: 175,030

[22] Filed: Dec. 29, 1993

[51] Int. Cl.⁶ .......................................... H01L 21/60
[52] U.S. Cl. .................................. 228/119; 228/264; 228/19; 228/41; 427/123; 427/383.7
[58] Field of Search ................... 228/119, 205, 248.1, 228/254, 264, 19, 35, 41; 427/123, 383.7, 405

[56] References Cited

U.S. PATENT DOCUMENTS

| | | | |
|---|---|---|---|
| 4,923,521 | 5/1990 | Liu et al. | 228/119 |
| 5,100,045 | 3/1992 | Wiand | 228/119 |
| 5,129,573 | 7/1992 | Duffey | 228/248.1 |
| 5,172,853 | 12/1992 | Maiwald | 228/248.1 |

*Primary Examiner*—Samuel M. Heinrich
*Attorney, Agent, or Firm*—Jeffrey L. Hood; James W. Huffman

[57] ABSTRACT

A rework process for ball grid array (BGA) packages which allows for reuse of devices that have been removed for lack of integrity of solder interconnections. The process uses a rework tool which comprises a plate including one or more depressions corresponding to the contours of inverted BGA packages. A BGA package to be reworked is placed in a respective depression with what remains of the original solder ball grid facing upward. The residual solder balls are wicked away, thus leaving the BGA package with the pads that the solder balls were attached to being exposed. A stencil with BGA patterns punched into it is then placed over the rework tool and solder paste is screened onto the rework tool so that the solder is deposited on the BGA pads via the openings in the stencil. The entire fixture is then subjected to a reflow process to cause the solder to ball up during this process. After the reflow process has completed, the stencil is removed, leaving behind a ball grid array similar to that found in the original package.

16 Claims, 4 Drawing Sheets

FIG. 6A
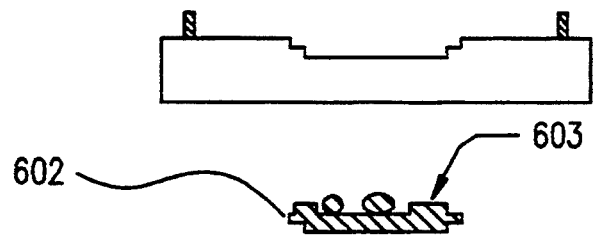
FIG. 6B
FIG. 6C
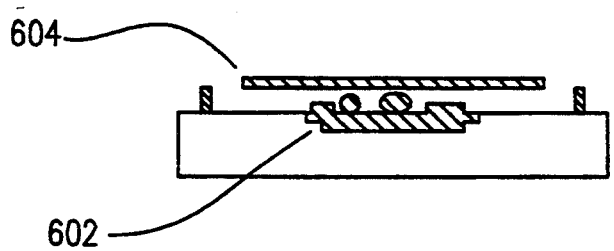
FIG. 6D
FIG. 6E
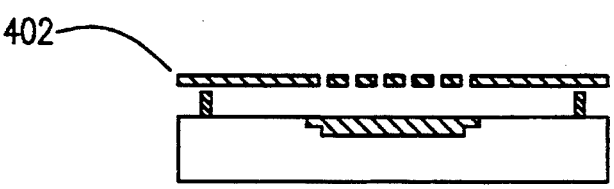
FIG. 6F
FIG. 6G
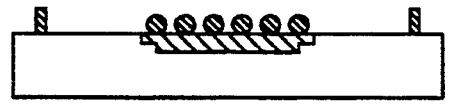
FIG. 6H
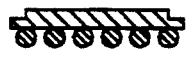

METHOD AND APPARATUS FOR REWORKING BALL GRID ARRAY PACKAGES TO ALLOW REUSE OF FUNCTIONAL DEVICES

FIELD OF THE INVENTION

The present invention relates to ball grid array packaging of semiconductor devices, and more particularly to a rework process for ball grid array packages that allows for reuse of functional devices that have been removed for lack of integrity of solder interconnections.

DESCRIPTION OF THE RELATED ART

There currently exist several different methods for packaging semiconductor devices. One popular type of semiconductor packaging is referred to as a quad flat pack (QFP), which is a type of a peripheral lead package. Other types of packaging technologies are referred to as wire bonding, flip chip attachment, and tape automated bonding (TAB), among others.

A new type of packaging technology is referred to as the ball grid array (BGA). The ball grid array was introduced by International Business Machines Corp. (IBM) and includes a number of benefits, including small package size, good yields, better electrical performance, and lower profiles, among others. Referring now to FIG. 1, BGA packaging comprises placing a semiconductor die on a ball grid array carrier which in turn includes a plurality of solder balls for connecting to solder on a circuit board. Ball grid arrays are basically pin grid arrays (PGAs) with solder balls replacing the pins to permit surface mounting. FIG. 2 illustrates a comparison of wire bond, flip chip, and ball grid array packages. As shown in FIG. 2, BGAs place contacts over the entire surface of the chip, instead of just around the edges. Thus, BGA packages allow system designers to place more leads in a given package size using looser tolerances than peripheral lead type packages such as the quad flat pack. Therefore, board producers are not required to use the fine pitch spacings that are now necessary for high lead count packages. Also, BGAs can have finer pitch spacings than pin grid arrays, since the solder balls do not have the coplanarity problems associated with through-hole PGAs.

In addition to increased I/O density for a given package size, BGA packaging provides greater yields during final assembly than other packaging methods. For example, if a BGA package does not align exactly when it is placed on the motherboard, it will align itself during reflow. The solder balls in the package are in contact with solder on the circuit board and thus, when the solder melts, the surface tension of the solder pulls it into the smallest shape possible, thus aligning the two sides. For more information on BGA packages, please see "IBM details its ball-grid array push," *Electronic Engineering Times*, Aug. 9, 1993 and "Ball Grid arrays: the hot new package," *Electronic Engineering Times*, Mar. 15, 1993.

In some instances during the BGA assembly process, the solder balls on the ball grid array carrier do not make adequate connection to the solder on the circuit board in which the ball grid array package is to be mounted. When a lack of integrity between the solder interconnections exists, the entire ball grid array package, i.e. the carrier and the semiconductor die mounted on the carrier, are typically removed using hot air for localized reflow, and then thrown away. Due to the rising costs of semiconductor devices, the loss of any number BGA packages and their accompanying die can be expensive, even if only a small number of ball grid array packages must be thrown away due to lack of integrity of solder interconnections. Therefore, a rework process for ball grid array packages is desired which allows for reuse of the package when it has been removed for lack of integrity of the solder interconnections.

SUMMARY OF THE INVENTION

The present invention comprises a rework process for ball grid array packages that have been removed for lack of solder interconnection integrity. The process uses a rework tool which comprises a plate including one or more depressions corresponding to the contours of inverted BGA packages. The rework apparatus also includes a stencil comprised of a non-wetting material with BGA patterns punched into it and which is adapted to fit onto the rework tool.

A BGA package to be reworked is placed in a respective depression with what remains of the original solder ball grid made accessible for the rework process. The residual solder balls are wicked away using a material such as Solderwick, thus leaving the BGA package with the pads that the solder balls were attached to being exposed. The stencil is then placed over the rework tool, and solder paste is screened onto the rework tool so that the solder is deposited on the BGA pads via the openings in the stencil. The rework apparatus is then subjected to a process similar to vapor phase reflow using an inert fluid with the stencil remaining on the rework tool during the reflow process. The surface tension causes the solder to ball up during this process, and the presence of the non-wettable stencil prevents ball to ball shorts caused by solder wicking in fine pitch devices. After the reflow has completed, the stencil is removed, leaving behind a ball grid array similar to that found in the original package. The reworked package is then removed, tested and then placed in a holding bin for reuse.

Therefore, a method and apparatus for reworking previously used ball grid array packages is disclosed. This process allows for reuse of ball grid array packages that otherwise would be thrown away, thus resulting in cost savings.

BRIEF DESCRIPTION OF THE DRAWINGS

A better understanding of the present invention can be obtained when the following detailed description of the preferred embodiment is considered in conjunction with the following drawings, in which:

FIG. 6 illustrates the rework apparatus during various steps of the rework process.

DETAILED DESCRIPTION OF THE PREFERRED EMBODIMENT

Figure 1:
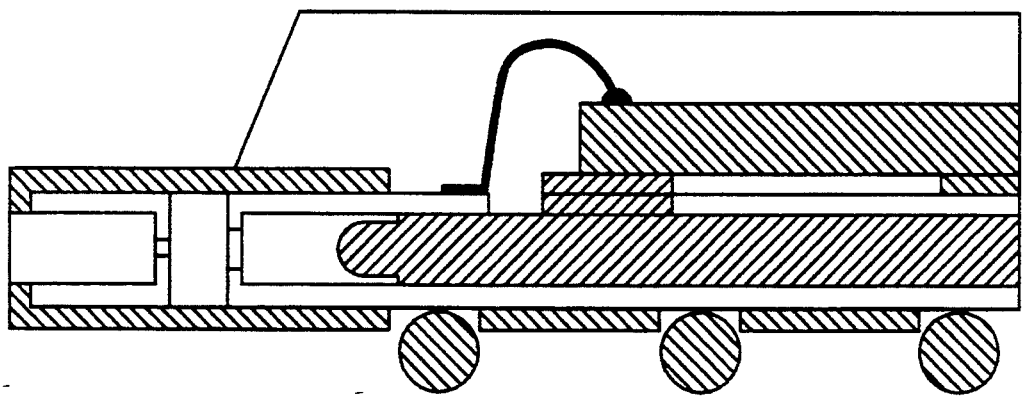
FIG. 1 is a prior art diagram illustrating a ball grid array package.
Figure 2:
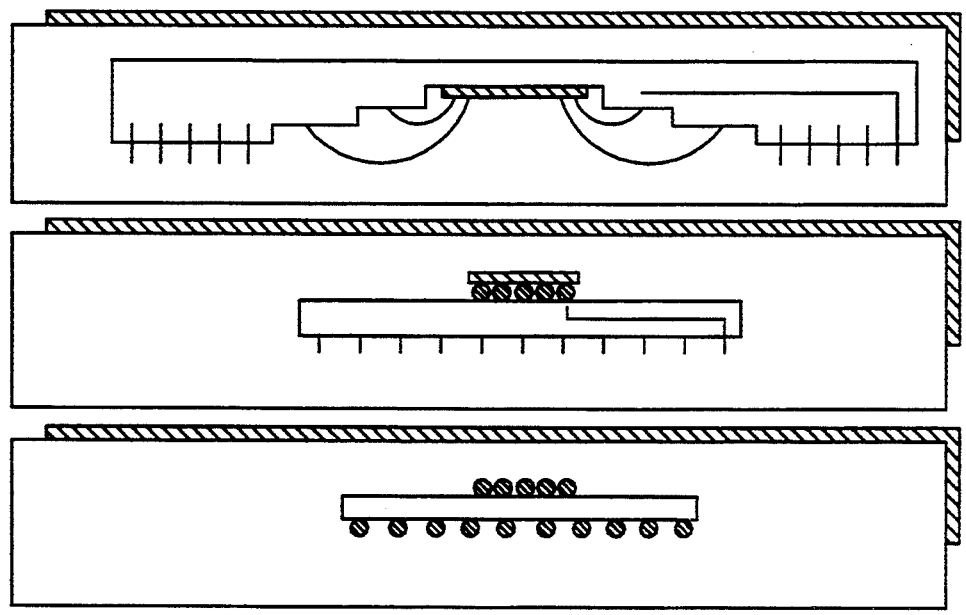
FIG. 2 is a prior art diagram illustrating various packaging technologies including wire bond, flip chip, and ball grid array.
Figure 3:
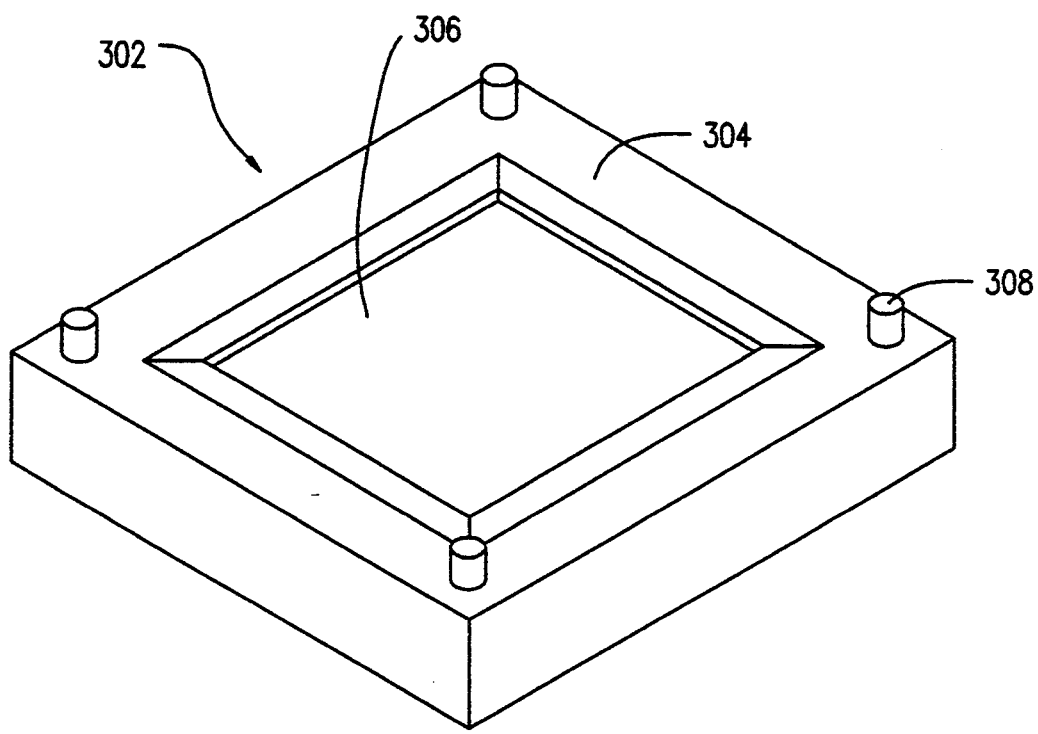
FIG. 3 is a perspective view of the rework tool used in the preferred embodiment.
Figure 4:
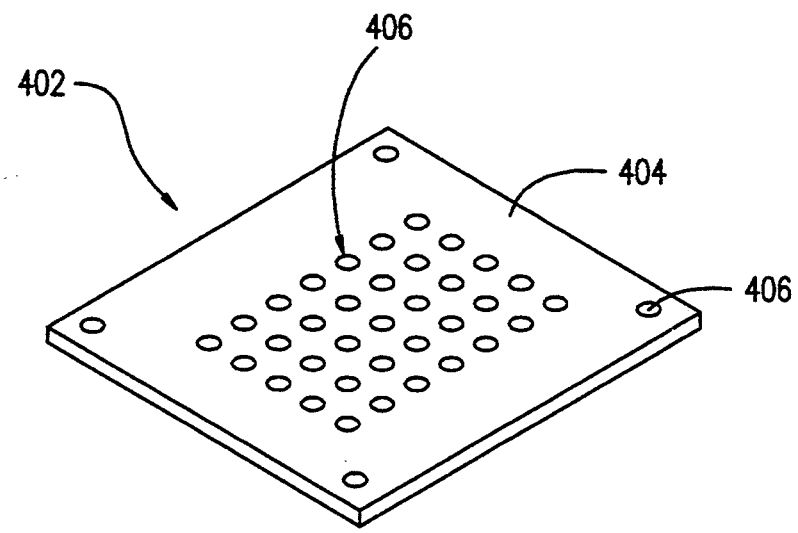
FIG. 4 is a perspective view of the stencil used in the rework process according to the preferred embodiment of the invention.

Referring now to FIG. 3, the rework process utilizes a tool referred to as a rework tool 302. The rework tool 302 comprises a plate 304 with one or more depressions 306 corresponding to the contour of respective inverted BGA packages (FIG. 6). In the preferred embodiment, the rework tool 302 includes a single engraved depression 306 corresponding to the contour of one inverted BGA package, and the preferred embodiment of the process reworks only one BGA package at a time. However, it is noted that any number of engraved depressions may be placed into the rework tool 302 to facilitate the reworking of more than one BGA package at the same time. Tooling pins 308 are preferably placed on the periphery of the rework tool 302. In the embodiment shown in FIG. 3, the rework tool is preferably rectangular and the four tooling pins are preferably placed at the periphery of the tool at each of the corners. The tooling pins 308 are for attachment of a stencil 402 which is illustrated in FIG. 4 and described below. It is noted that the arrangement of the tooling pins 308 is essentially a design choice, and other arrangements are also possible.

Referring now to FIG. 4, stencil 402 comprises a plate 404 which includes holes 406 located at the periphery of the plate 404. The holes 406 are adapted for mating with the tooling pins 308 located at the periphery of the rework tool 302. The stencil 402 also includes a BGA pattern of holes 408, as shown. As discussed below, the stencil 402 is adapted for placement on top of the rework tool 302 over an inverted BGA package that has been placed in the depression 306 of the rework tool 302. The BGA pattern of holes 408 are adapted to align with the solder ball grid or pattern of the BGA package being reworked.

Figure 5:
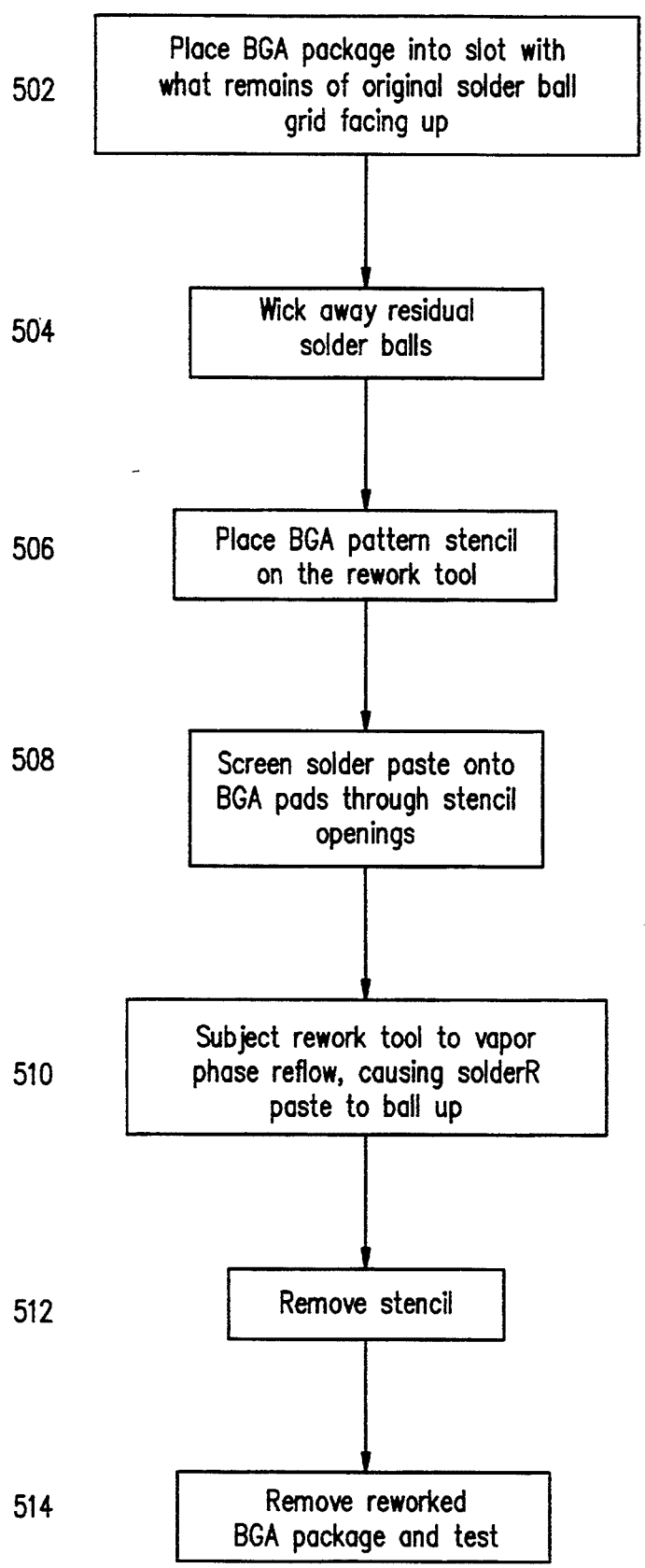
FIG. 5 is a flowchart diagram illustrating the rework process according to the preferred embodiment of the invention.

Referring now to FIG. 5, a flowchart diagram illustrating the rework process according to the preferred embodiment of the present invention is shown. The process of the present invention utilizes the rework tool 302 and the stencil 402. As previously noted, the rework process is preferably adapted for the reworking of a single ball grid array package. However, the process may also be used to rework a plurality of BGA packages at a time. FIG. 6 illustrates operation of the rework process, and the rework process illustrated in FIG. 5 is described in conjunction with FIG. 6 for clarity.

Referring again to FIG. 5, the rework process operates as follows. In step 502 the BGA package 602 (FIG. 6B) to be reworked is placed into the depression 306 of the rework tool 302 with what remains of the original solder ball grid 603 facing up. It should be understood that alternative orientations are possible for reworking the BGA package 602. A side view of the rework tool 302 is shown in FIG. 6A, and the placement of the BGA package 602 into the rework tool 302 is illustrated in FIG. 6B. In step 504 the residual solder balls are wicked away from the BGA package 602, preferably using an off the shelf material such as Solderwick 604 (FIG. 6C). Solderwick essentially comprises a thin copper sheet with flux on the surface to facilitate solder removal upon contact. It is noted that other materials may be used to wick away the residual solder balls, as desired. Upon completion of this step, the BGA package 602 remains with the pads to which the solder balls were attached being exposed, as shown in FIG. 6D.

In step 506 the stencil 402 is placed onto the rework tool 302 such that the holes 408 at the periphery of the stencil 402 are placed over the tooling pins 308 of the rework tool 302. This step is illustrated in FIG. 6E. As previously mentioned, the stencil 402 includes a BGA pattern punched into it corresponding to the solder ball grid of the BGA package being reworked. The stencil is preferably made of a non-wetting material such as molybdenum or Teflon. As discussed below, this material prevents ball-to-ball shorts as solder balls are added later in the process. In step 508 solder paste is screened onto the rework tool 302 and stencil 402 so that solder is deposited on the BGA pads via the openings in the stencil 402. This is illustrated in FIG. 6F. Together, the rework tool 302, the BGA package 602, and the stencil 402 are referred to as the rework fixture.

In step 510 the rework fixture is then subjected to a process similar to vapor phase reflow using an inert fluid. As is well known in the art, vapor phase reflow is used to melt solder to form solder interconnections. It is also noted that an infrared reflow process may be used as described. During this reflow process the surface tension on the stencil causes the solder paste to ball up. The stencil 402 preferably remains on the rework tool 302 during the reflow process. The non-wettable stencil 402 prevents ball-to-ball shorts caused by solder wicking in fine pitch devices during reflow. After the reflow process has completed in step 510, the stencil is removed in step 512 leaving behind a ball grid array similar to that found on the original package, as shown in FIG. 6G. The reworked BGA package is then removed from the rework tool 302 in step 514 and appears as illustrated in FIG. 6H. The reworked BGA package may then be tested and then optionally placed in a holding bin for reuse.

Therefore, a method and apparatus for reworking ball grid array packages that have been removed for lack of integrity of solder interconnections is disclosed. This rework process allows the functional device to be reused, i.e., allows the ball grid array carrier and semiconductor device to be reused, whereas in the past a lack of integrity of solder interconnections essentially meant that the package would be thrown away. This results in cost savings.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A method for reworking a ball grid array package that has been removed for lack of integrity of solder interconnections, comprising:
   placing at least one ball grid array package having a solder ball grid into a rework tool;
   wicking away residual solder balls from the solder ball grid;
   placing a stencil onto the rework tool over the ball grid array package, wherein the stencil includes a pattern of openings corresponding to the solder ball grid on the ball grid array package; and
   depositing solder balls onto the ball grid array package via the pattern openings in the stencil, thereby producing a new solder ball grid on the ball grid array package.

2. The method of claim 1, wherein said step of depositing comprises:
   screening solder paste onto the ball grid array package through the pattern openings in the stencil; and
   subjecting the ball grid array package to a reflow process to cause the solder to ball up after said step of screening.

3. The method of claim 2, wherein said step of subjecting comprises subjecting the ball grid array package to a vapor phase reflow process to cause the solder to ball up.

4. The method of claim 1, further comprising:
   removing the stencil after said step of depositing; and
   removing the ball grid array package from the rework tool after removing the stencil.

5. The method of claim 1, wherein said step of wicking away comprises applying solderwick to the residual solder balls.

6. The method of claim 1, wherein the rework tool comprises a plate including a depression adapted for receiving the ball grid array package.

7. The method of claim 1, wherein the rework tool includes a plurality of tooling pins and the stencil includes a plurality of holes corresponding to the plurality of tooling pins, wherein the stencil is placed on the rework tool such that the holes align with the tooling pins.

8. The method of claim 1, wherein the stencil is comprised of a non wettable material to prevent ball to ball shorts.

9. The method of claim 1, wherein said step of placing comprises placing a plurality of ball grid array packages into the rework tool, each of the ball grid array packages having a solder ball grid;
   wherein said step of wicking away comprises wicking away residual solder balls from each of the solder ball grids;
   wherein the stencil includes a plurality of pattern openings corresponding to the solder ball grids; and
   wherein said step of depositing comprises depositing solder balls onto each of the plurality of ball grid array packages via the plurality of pattern openings in the stencil.

10. An apparatus for reworking one or more ball grid array packages that have been removed for lack of integrity of solder interconnections, wherein said one or more ball grid array packages each include a solder ball grid, the apparatus comprising:
    a rework tool comprising a plate with at least one depression, said depression adapted for receiving a ball grid array package;
    means for wicking away residual solder balls from the solder ball grid of the ball grid array package, thereby exposing a grid of solder ball pads;
    a stencil having a ball grid array pattern of openings corresponding to the solder ball grid of the ball grid array package, wherein said stencil is adapted for placement on said rework tool over the ball grid array package such that said solder ball pads are visible through said ball grid array pattern openings; and
    means for depositing solder balls on said solder ball pads comprised on the ball grid array package through said ball grid array pattern openings in said stencil.

11. The apparatus of claim 10, wherein said means for depositing solder balls comprises:
    means for screening solder paste onto said ball grid array package through said ball grid array pattern openings; and
    means for subjecting the ball grid array package to a reflow process to cause said solder to ball up after operation of said means for screening.

12. The apparatus of claim 11, wherein said means for subjecting comprises means for subjecting said ball grid array package to a vapor phase reflow process to cause said solder to ball up.

13. The apparatus of claim 10, wherein said means for wicking away comprises means for applying solderwick to residual solder balls on the solder ball grid.

14. The apparatus of claim 10, wherein said rework tool comprises a plate including a depression adapted for receiving the ball grid array package.

15. The apparatus of claim 10, wherein said rework tool includes a plurality of tooling pins and said stencil includes a plurality of holes corresponding to said tooling pins, wherein said stencil is placed on said rework tool such that said holes align with said tooling pins.

16. The apparatus of claim 10, wherein said stencil is comprised of a non-wettable material to prevent ball to ball shorts.

* * * * *